US008941528B2

(12) United States Patent
Yun

(10) Patent No.: US 8,941,528 B2
(45) Date of Patent: Jan. 27, 2015

(54) ANALOG TO DIGITAL CONVERSION CIRCUIT, IMAGE SENSING DEVICE HAVING THE SAME AND METHOD OF DRIVING IMAGE SENSING DEVICE

(71) Applicant: SK Hynix Inc., Gyeonggi-do (KR)

(72) Inventor: Gun-Hee Yun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/049,946

(22) Filed: Oct. 9, 2013

(65) Prior Publication Data

US 2014/0354865 A1 Dec. 4, 2014

(30) Foreign Application Priority Data

May 30, 2013 (KR) .................. 10-2013-0061401

(51) Int. Cl.
*H03M 1/56* (2006.01)
*H04N 5/3745* (2011.01)
*H03M 1/38* (2006.01)

(52) U.S. Cl.
CPC ............. *H04N 5/37455* (2013.01); *H03M 1/38* (2013.01)
USPC .......................................... 341/169; 341/155

(58) Field of Classification Search
CPC ......... H03M 1/56; H03M 1/58; H03M 1/447; H03M 1/12; H03M 1/123; H03M 1/54; G09G 2310/027; G09G 3/3233; H04N 5/3597; H04N 5/3745
USPC ........................... 341/169, 155, 144, 156, 135
See application file for complete search history.

(56) References Cited

U.S. PATENT DOCUMENTS

| | | | |
|---|---|---|---|
| 6,956,413 B2* | 10/2005 | Bailey ........................... 327/131 |
| 7,088,279 B2 | 8/2006 | Muramatsu et al. |
| 7,804,535 B2* | 9/2010 | Muramatsu et al. .......... 348/273 |
| 8,654,230 B2* | 2/2014 | Wakabayashi et al. ....... 348/301 |
| 8,659,465 B2* | 2/2014 | Simony et al. ................ 341/169 |
| 8,674,865 B2* | 3/2014 | Asayama et al. ............. 341/144 |
| 2005/0072978 A1* | 4/2005 | Raynor ........................... 257/75 |
| 2008/0316163 A1* | 12/2008 | Van Den Homberg et al. 345/98 |
| 2012/0119063 A1* | 5/2012 | Takamiya et al. .......... 250/208.1 |
| 2013/0154705 A1* | 6/2013 | Sakurai et al. ................ 327/179 |

FOREIGN PATENT DOCUMENTS

| | | |
|---|---|---|
| KR | 1020110057678 | 6/2011 |
| KR | 1020110129543 | 12/2011 |

OTHER PUBLICATIONS

Lim, S., et al., A High-Speed CMOS Image Sensor With Column-Parallel Two-Step Single-Slope ADCs, IEEE Transactions on Electron Devices, Mar. 2009, pp. 393-398, vol. 56, No. 3.
Lee, J., et al., A 10b Column-wise Two-step Single-slope ADC for High-speed CMOS Image Sensor, International Image Sensor Workshop, pp. 196-199, 2009.

* cited by examiner

*Primary Examiner* — Peguy Jean Pierre
(74) *Attorney, Agent, or Firm* — IP & T Group LLP

(57) ABSTRACT

An analog-to-digital conversion circuit includes a reference current generating unit suitable for generating a reference current varied by a given level in a sampling stage, a ramp voltage generating unit suitable for generating a ramp voltage corresponding to the reference current, and a comparison unit suitable for comparing the ramp voltage with a voltage level of a pixel signal to output a comparison signal.

19 Claims, 5 Drawing Sheets

ANALOG TO DIGITAL CONVERSION CIRCUIT, IMAGE SENSING DEVICE HAVING THE SAME AND METHOD OF DRIVING IMAGE SENSING DEVICE

CROSS-REFERENCE TO RELATED APPLICATIONS

The present application claims priority of Korean Patent Application No. 10-2013-0061401, filed on May 30, 2013, which is incorporated herein by reference in its entirety.

BACKGROUND

1. Field

Exemplary embodiments of the present invention relate to an analog-to-digital conversion circuit, an image sensing device having the same, and a method for driving the image sensing device.

2. Description of the Related Art

In general, a charge coupled device (CCD) and a CMOS image sensor (CIS) are widely in use as image pickup devices for converting an optical image into an electrical signal.

Manufacturing a CMOS image sensor through a general CMOS process may be considered more economical than manufacturing an image pickup device using a CCD, as a CMOS image sensor as an analog to digital converting device may be integrated in a single chip. In addition, a CMOS image sensor may be more suitable for low voltage and low power consumption design needed in various mobile applications such as the mobile phones, digital cameras, etc.

A CMOS image sensor may require a high resolution analog to digital converting device for converting an analog signal outputted from an active pixel sensor (APS), which reactives to light, into a digital signal.

SUMMARY

Various exemplary embodiments are directed to an analog-to-digital conversion circuit, an image sensing circuit, and a method for driving an image sensing circuit, capable of providing a high-speed operation.

In accordance with an exemplary embodiment of the present invention, an analog-to-digital conversion circuit may include a reference current generating unit suitable for generating a reference current varied by a given level in a sampling stage, a ramp voltage generating unit suitable for generating a ramp voltage corresponding to the reference current, and a comparison unit suitable for comparing the ramp voltage with a voltage level of a pixel signal to output a comparison signal.

In accordance with an exemplary embodiment of the present invention, an analog-to-digital conversion circuit may include a plurality of current sources sequentially activated in a plurality of sampling stages, each current source suitable for generating a reference current which is adjusted upward or downward by a different level in a corresponding sampling stage, a ramp voltage generating unit suitable for generating a ramp voltage corresponding to the reference current, and a comparison unit suitable for comparing the ramp voltage with a voltage level of a pixel signal to output a comparison signal.

In accordance with an exemplary embodiment of the present invention, an analog-to-digital conversion circuit may include a plurality of sinking units coupled between a ground voltage terminal and a reference node in parallel, each sinking unit suitable for generating a reference current corresponding to a bias signal at the reference node, in the sampling stage, a plurality of switching units suitable for selectively transferring the bias signal to one of the sinking units in response to a plurality of switching signals, at least one storage unit coupled to a node between the switching units and the sinking units, suitable for storing a voltage level of the bias signal, a ramp voltage generating unit coupled between a supply voltage terminal and the reference node, suitable for generating a ramp voltage corresponding to the reference current, a comparison unit suitable for comparing the ramp voltage with a voltage level of a pixel signal to output a comparison signal, and a control unit suitable for generating the switching signals in response to a plurality of step signals, which are sequentially activated at the sampling stages, and the comparison signal.

In accordance with an exemplary embodiment of the present invention, an image sensing device may include a pixel unit suitable for outputting a pixel signal with a level corresponding to incident light, a digital-to-analog converter suitable for generating a sampling current which is used in a sampling stage, and adjusted upward or downward in a corresponding sampling stage, and an analog-to-digital converter suitable for generating a digital signal corresponding to the pixel signal based on a reference current generated by mirroring the sampling current.

In accordance with an exemplary embodiment of the present invention, an image sensing device may include a pixel unit suitable for outputting a pixel signal with a level corresponding to incident light, a first current mirroring unit suitable for mirroring a source current to generate a sampling current which is used in a sampling stage and adjusted upward or downward in the sampling stage in response to a control code, a second current mirroring unit suitable for generating a bias signal corresponding to the sampling current; a plurality of sinking units coupled between a ground voltage terminal and a reference node in parallel, each sinking unit suitable for generating a reference current corresponding to the bias signal at the reference node, in a corresponding sampling stage, a plurality of switching units suitable for selectively transferring the bias signal to one of the sinking units in response to a plurality of switching signals, at least one storage unit coupled to a node between the switching units and the sinking units, suitable for storing a voltage level of the bias signal, a ramp voltage generating unit coupled between a supply voltage terminal and the reference node, suitable for generating a ramp voltage corresponding to the reference current; a comparison unit suitable for comparing the ramp voltage with the pixel signal to output a comparison signal, and a control unit suitable for generating the switching signals in response to a plurality of step signals, which are sequentially activated at the corresponding sampling stage, and the comparison signal.

In accordance with an exemplary embodiment of the present invention, a method for driving an image sensing device may include in a first sampling step, mirroring a source current to generate a sampling current which is adjusted downward by a first level in response to a control code, generating a ramp voltage corresponding to a reference current by mirroring the sampling current, and sampling a pixel signal outputted from a pixel based on the ramp voltage; and in a second sampling step, mirroring the source current to generate the sampling current which is adjusted upward by a second level in response to the control code, generating the ramp voltage corresponding to the reference current by mirroring the sampling current, and sampling the pixel signal based on the ramp voltage.

DETAILED DESCRIPTION

Figure 1:
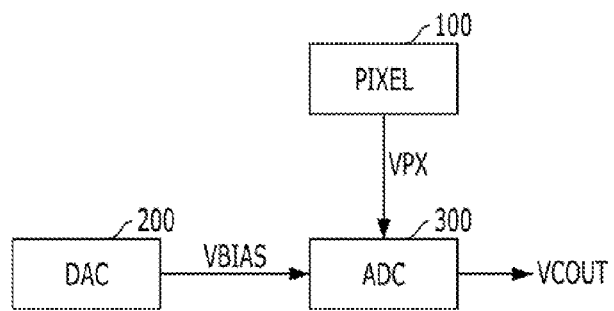
FIG. 1 is a block diagram of an image sensing device in accordance with an exemplary embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram of an image sensing device in accordance with an exemplary embodiment of the present invention.

Referring to FIG. 1, the image sensing device includes a pixel unit 100, a digital-to-analog converter (DAC) 200, and an analog-to-digital converter (ADC) 300. The pixel unit 100 serves to output a pixel signal VPX with a level corresponding to incident light. The DAC 200 serves to generate a bias signal VBIAS. The ADC 300 serves to sample the pixel signal VPX in response to the bias signal VBIAS to output a comparison signal VCOUT of a digital signal.

Here, the DAC 200 generates sampling current which is used in a plurality of sampling stages and adjusted upward or downward in each of the sampling stages, and provides the bias signal VBIAS corresponding to the sampling current to the ADC 300.

The ADC 300 mirrors the sampling current generated in the DAC 200 in response to the bias signal VBIAS to generate reference current, and samples the pixel signal VPX based on the reference current. For example, the ADC 300 may sample the pixel signal VPX by comparing the sampling current with the reference current in each of the sampling stages. If the pixel signal VPX is outputted as a current level, the reference current may be directly compared with the pixel signal VPX.

Hereinafter, a case where the pixel signal VPX is outputted as a current level will be explained in detail.

Figure 2:
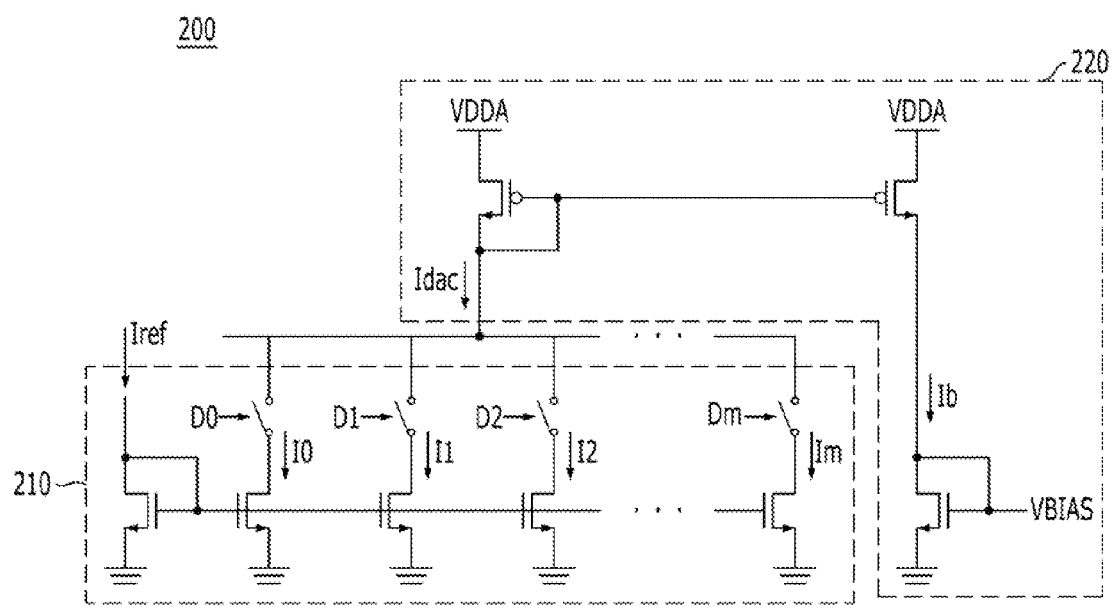
FIG. 2 is a detailed circuit diagram of a digital-to-analog converter shown in FIG. 1.

FIG. 2 is a detailed circuit diagram of the digital-to-analog converter (DAC) 200 shown in FIG. 1.

Referring to FIG. 2, the DAC 200 includes a first current mirroring unit 210 and a second current mirroring unit 220. The first current mirroring unit 210 mirrors source current Iref to generate sampling current Idac which is used in each of a plurality of sampling stages, and adjusted upward by a first level, or downward by a second level in each of the sampling stages in response to a control code D0 to Dm. The second current mirroring unit 220 generates the bias signal VBIAS corresponding to the sampling current Idac.

The first current mirroring unit 210 includes a plurality of current mirroring sections and a plurality of switching sections. The current mirroring sections mirror the source current Iref. Each of the switching sections performs a switching operation to add the source current Iref, which is mirrored by some current mirroring sections among the plurality of current mirroring sections in response to the control code D0 to Dm, to a node where the sampling current Idac is generated. Here, the sampling current Idac has current amount corresponding to several times of the source current Iref, and may be adjusted upward or downward in a step wise manner.

The second current mirroring unit 220 generates bias current Ib by mirroring the sampling current Idac to output the bias signal VBIAS corresponding to the bias current Ib to the ADC 300.

Figure 3:
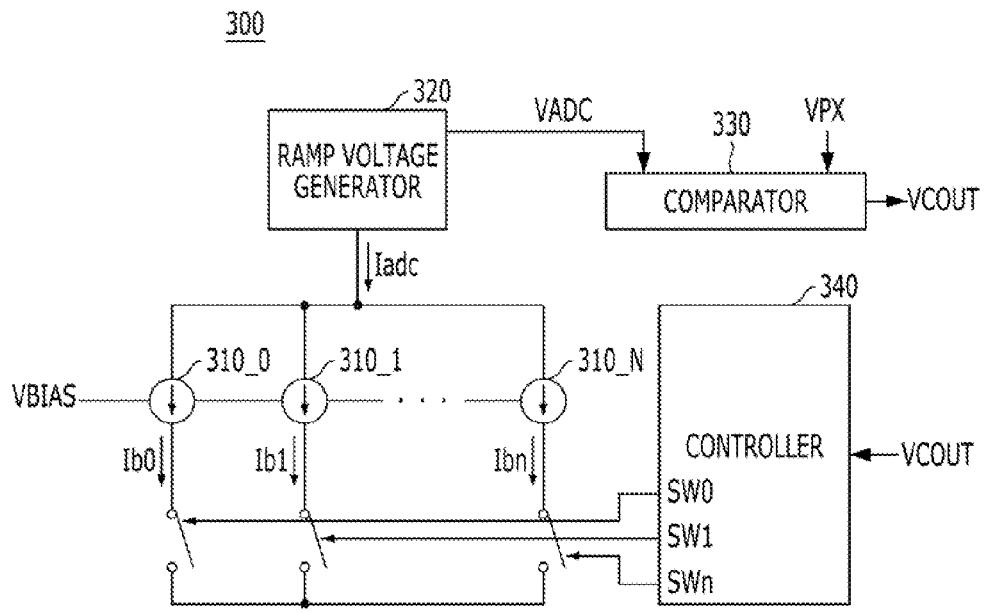
FIG. 3 is a circuit diagram of an analog-to-digital converter shown in FIG. 1.

FIG. 3 is a circuit diagram of the analog-to-digital converter (ADC) 300 shown in FIG. 1.

Referring to FIG. 3, the ADC 300 includes a plurality of current sources 310_0 to 310_N, a ramp voltage generator 320, a comparator 330, and a controller 340. The current sources 310_0 to 310_N are sequentially enabled in the plurality of the sampling stages, and generate reference current Iadc which is adjusted upward or downward by a different level in response to the bias signal VBIAS. The ramp voltage generator 320 generates a ramp voltage VADC corresponding to the reference current Iadc. The comparator 330 compares the ramp voltage VADC with the pixel signal VPX. The controller 340 controls an activation of the current sources 310_0 to 310_N.

The current sources 310_0 to 310_N may be designed to generate the reference current Iadc which is adjusted from a coarse level to a fine level according as the number of the sampling stage increases, and the controller 340 may be designed to control a plurality of switching sections coupled to a current path of the current sources 310_0 to 310_N. The number of the current sources 310_0 to 310_N, i.e., (N+1), is identical to the number of the plurality of the sampling stages. For example, three current sources are required for three times of the sampling stages.

Meanwhile, the ADC 300 may further include at least one memory unit (not shown) to store a current level of the reference current Iadc so as to reflect a current level of the reference current Iadc corresponding a sampling result in a previous sampling stage on a next sampling stage.

Figure 4:
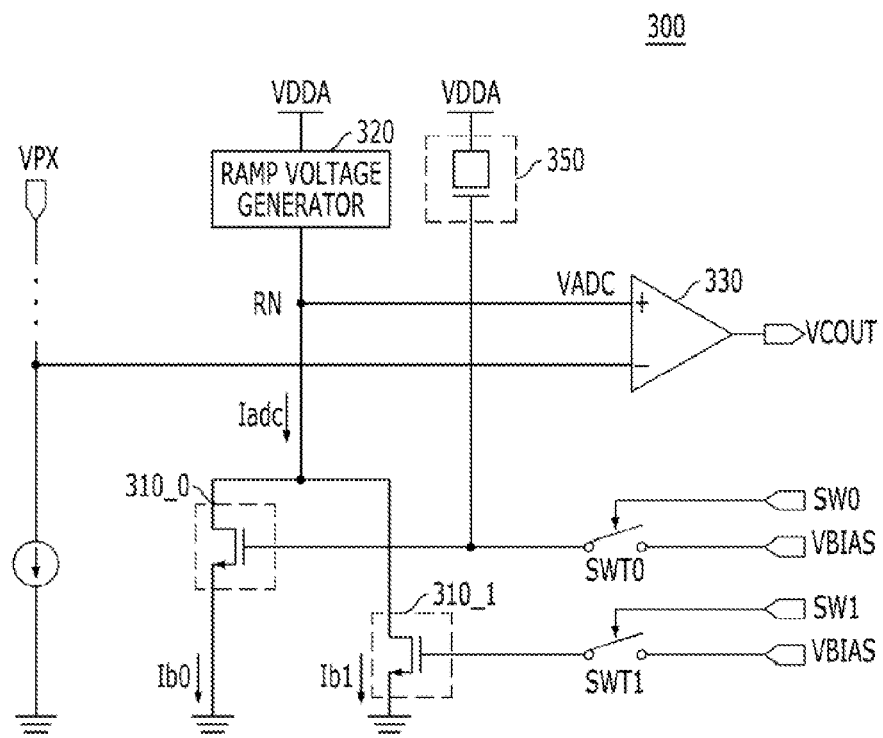
FIG. 4 is a detailed circuit diagram of the analog-to-digital converter shown in FIG. 3.
Figure 5A:
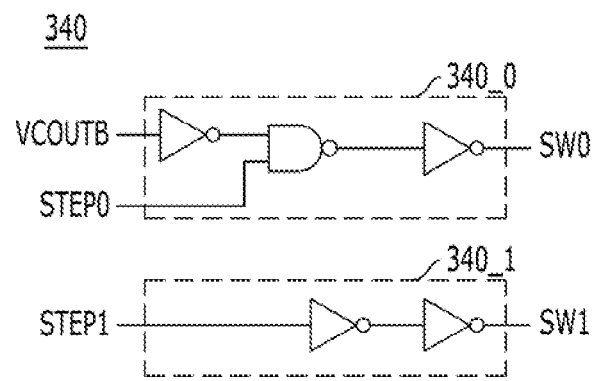
FIGS. 5A to 5B are detailed circuit diagrams of a controller shown in FIG. 3.
Figure 5B:
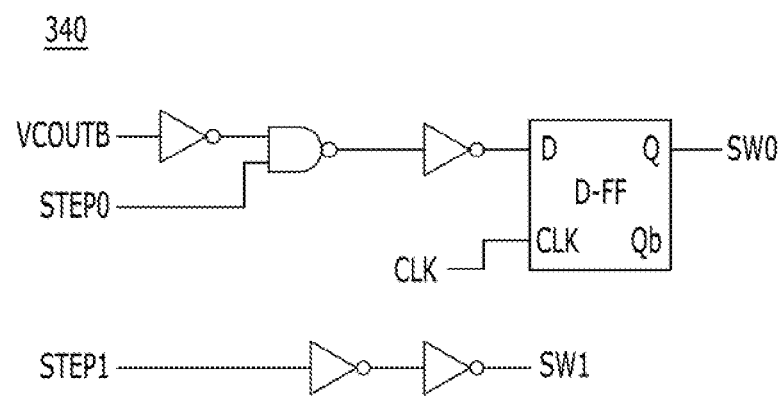

FIG. 4 is a detailed circuit diagram of the ADC 300 shown in FIG. 3. FIGS. 5A to 5B are detailed circuit diagrams of the controller 340 shown in FIG. 3.

In FIGS. 4 to 5B, the elements which are identical with the constituent elements shown in FIG. 3 are assigned the same reference numerals, and two sinking units are exemplarily explained as the current sources 310_0 to 310_N of FIG. 3.

Referring to FIG. 4, the ADC 300 includes first and second sinking units 310_0 and 310_1, first and second switching units SWT0 and SWT1, at least one storage unit 350, a ramp voltage generator 320, and a comparator 330. The first and second sinking units 310_0 and 310_1 are coupled between a ground voltage terminal and a reference node RN in parallel, and sequentially generate the reference current Iadc corresponding to the bias signal VBIAS at the reference node RN, in each of the plurality of the sampling stages. The first and second switching units SWT0 and SWT1 selectively transfer the bias signal VBIAS to one of the first and second sinking units 310_0 and 310_1 in response to first and second switching signals SW0 and SW1. The storage unit 350 is coupled to a node between the first switching unit SWT0 and the first sinking unit 310_0, and stores a voltage level of the bias signal VBIAS. The ramp voltage generator 320 is coupled between a supply voltage VDDA terminal and the reference node RN, and generates the ramp voltage VADC corresponding to the reference current Iadc. The ramp voltage generator 320 may be implemented with a resistor. The comparator 330 compares the ramp voltage VADC with the pixel signal VPX.

In detail, each of the first and second sinking units 310_0 and 310_1 includes an NMOS transistor having a drain-source path between the reference node RN and the ground voltage terminal, and a gate receiving the bias signal VBIAS. At this time, the NMOS transistors included in the first and second sinking units 310_0 and 310_1 have a different size from each other. The first and second sinking units 310_0 and 310_1 form a current mirroring structure with an NMOS transistor, which is included in the second current mirroring unit 220 of the DAC 200 and outputs the bias signal VBIAS, through a common gate connection. Accordingly, when the first and second switching units SWT0 and SWT1 are closed, the first and second sinking units 310_0 and 310_1 mirror the sampling current Idac to generate the reference current Iadc. At this time, since the NMOS transistors included in the first and second sinking units 310_0 and 310_1 have a different size from each other, the first and second sinking units 310_0 and 310_1 may generate the reference current Iadc which is adjusted upward or downward by a different level. That is, when the DAC 200 generates the sampling current Idac which is adjusted by the same level in each of the plurality of the sampling stages, the first and second sinking units 310_0 and 310_1 of the ADC 300 generates the reference current Iadc which is adjusted by a different level in each of the plurality of the sampling stages. Contrary, if the DAC 200 generates the sampling current Idac which is adjusted by a different level in each of the plurality of the sampling stages, the NMOS transistors of the first and second sinking units 310_0 and 310_1 may be designed to have the same size.

The comparator 330 compares the ramp voltage VADC at the reference node RN with a voltage level of the pixel signal VPX inputted through a source follower, and outputs the comparison signal VCOUT of a digital signal.

The storage unit 350 stores and maintains the voltage level of the bias signal VBIAS just before the first switching unit SWT0 is open. Thus, even though the first switching unit SWT0 is open, the reference current Iadc corresponding to the voltage level of the bias signal VBIAS stored in the storage unit 350 may flow. For example, the storage unit 350 may include a capacitor.

Meanwhile, the ADC 300 also may include a controller 340 which generates the first and second switching signals SW0 and SW1 in response to first and second step signals STEP0 and STEP1, which are sequentially activated according to first and second sampling stages, and the comparison signal VCOUT.

In an exemplary embodiment, referring to FIG. 5A, the controller 340 includes a first logic operation unit 340_0 and a second logic operation unit 340_1. The first logic operation unit 340_0 generates the first switching signal SW0 by logically combining the comparison signal VCOUT and the first step signal STEP0, and the second logic operation unit 340_1 generates the second switching signal SW1 based on the second step signal STEP1. In another exemplary embodiment, referring to FIG. 5B, the controller 340 may generate the first switching signal SW0 in synchronization with a clock signal CLK. By operating the first switching unit SWT0 in synchronization with the clock signal CLK, an exact level of the bias signal VBIAS may be stored in the storage unit 350.

Figure 7:
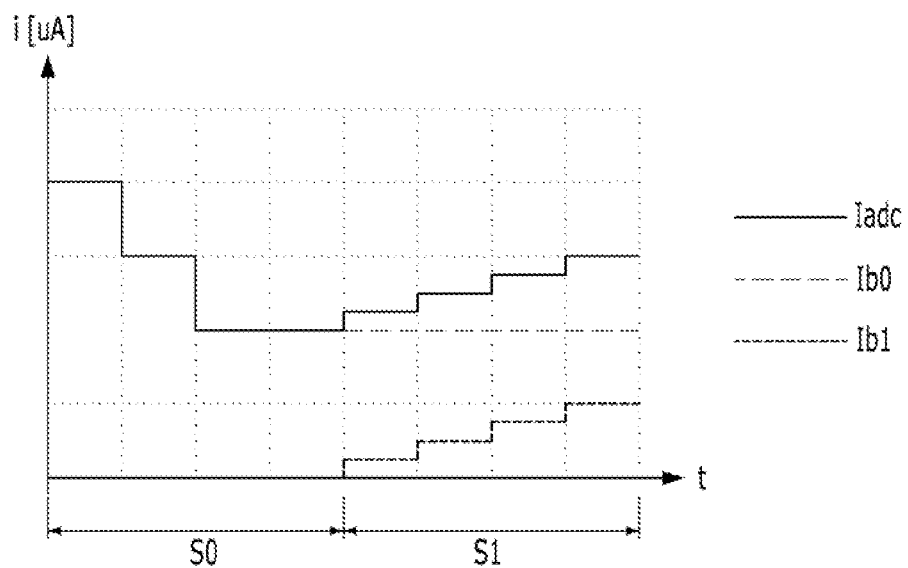
FIGS. 7 and 8 are graphs illustrating the operation of the image sensing device shown in FIG. 6.
Figure 8:
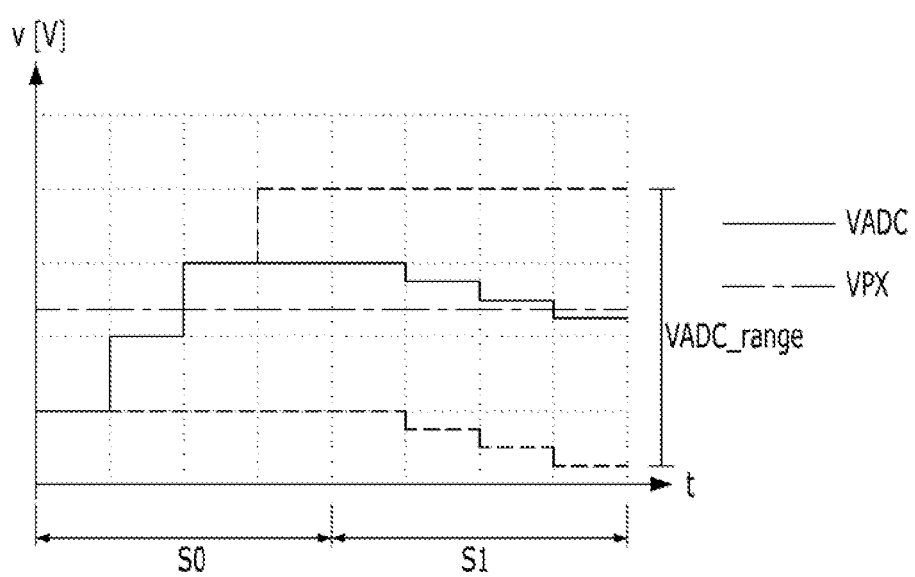

Hereinafter, referring to FIGS. 6 to 8, a method for driving an image sensing device in accordance with an exemplary embodiment will be explained in detail.

Figure 6:
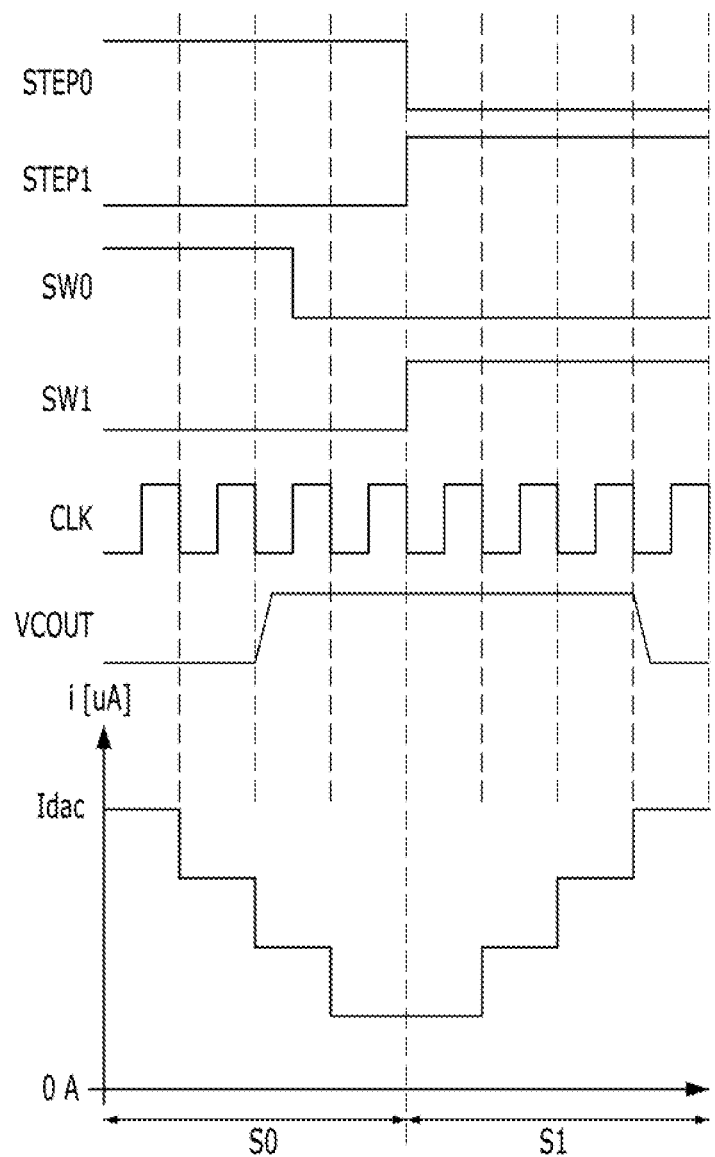
FIG. 6 is a timing diagram explaining an operation of an image sensing device in accordance with the embodiment.

FIG. 6 is a timing diagram explaining an operation of an image sensing device in accordance with the exemplary embodiment of the present invention. FIGS. 7 and 8 are graphs illustrating the operation of the image sensing device shown in FIG. 6. In FIG. 7, a graph illustrating the reference current Iadc corresponding to the sampling current Idac is shown, and in FIG. 8, a graph illustrating the ramp voltage VADC tracking the pixel signal VPX in each of the first and second sampling stages S0 and S1.

Referring to FIG. 6, the method for driving the image sensing device includes the first sampling stage S0 and the second sampling stage S1. In the first sampling stage S0, the sampling current Idac is generated by mirroring the source current Iref while being adjusted downward by a given level at every clock signal CLK in response to the control code D0 to Dm, the ramp voltage VADC is generated corresponding to the reference current Iadc by mirroring the sampling current Idac, and the pixel signal VPX is sampled based on the ramp voltage VADC. In the second sampling stage S1, the sampling current Idac is generated by mirroring the source current Iref while being adjusted upward by a given level at every clock signal CLK in response to the control code D0 to Dm, the ramp voltage VADC is generated corresponding to the reference current Iadc by mirroring the sampling current Idac, and the pixel signal VPX is sampled based on the ramp voltage VADC.

In detail, in the first sampling stage S0, the DAC 200 generates the sampling current Idac which is adjusted downward by the given level at every clock signal CLK from a maximum level. The first sinking unit 310_0 of the ADC 300 generates the reference current Iadc corresponding to the bias signal VBIAS at the reference node RN when the first switching unit SWT0 is closed according as the first switching signal SW0 is activated in response to an activation of the first step signal STEP0. At this time, the reference current Iadc is adjusted downward by the same level as the sampling current Idac as shown in FIG. 7, and the ramp voltage VADC is adjusted upward based on the reference current Iadc. Here, the ramp voltage VADC is adjusted by a coarse level as shown in FIG. 8. Thereafter, when the ramp voltage VADC is greater than a voltage level of the pixel signal VPX, the comparator 300 activates and outputs the comparison signal VCOUT, the first switching unit SWT0 is open according as the first switching signal SW0 is deactivated in response to an activation of the comparison signal VCOUT. At this time, since the storage unit 350 stores and maintains the voltage level of the bias signal VBIAS just before the first switching unit SWT0 is open, current Ib0 flowing on the first sinking unit 310_0 just before the first switching unit SWT0 is open becomes the reference current Iadc, as shown in FIG. 7. Meanwhile, the DAC 200 adjusts the sampling current Idac downward until the maximum level.

In detail, in the second sampling stage S1, the DAC 200 generates the sampling current Idac which is adjusted upward by the given level at every clock signal CLK from a minimum level. The second sinking unit 310_1 of the ADC 300 generates current Ib1 corresponding to the bias signal VBIAS when the second switching unit SWT1 is closed according as the second switching signal SW1 is activated in response to an activation of the second step signal STEP1. At this time, the reference current Iadc has current amount by summing the current Ib0 flowing on the first sinking unit 310_0 and the current Ib1 flowing on the second sinking unit 310_1, as shown in FIG. 7. Accordingly, a result of the first sampling stage S0 is reflected on the second sampling stage S1, and the ramp voltage VADC is adjusted downward from a voltage level just before the first switching unit SWT0 is open. Here, the ramp voltage VADC is adjusted downward by a fine level as shown in FIG. 8, because the reference current Iadc is adjusted upward by a fine level, as shown in FIG. 7, by designing the NMOS transistor included in the second sinking unit 310_1 to have a size smaller than the NMOS transistor included in the first sinking unit 310_0. Thereafter, when the ramp voltage VADC is smaller than a voltage level of the pixel signal VPX, the comparator 300 deactivates and outputs the comparison signal VCOUT.

As is apparent from the above descriptions, in the embodiments of the present disclosure, two or more sampling operations are performed when a pixel signal measured, and thus a sampling time may be reduced. In particular, by reflecting a current level corresponding to a sampling result in a previous sampling stage on a next sampling stage, three or more sampling operations is possible. As a consequence, the image sensing device may provide a high-speed operation.

Although various embodiments have been described for illustrative purposes, it will be apparent to those skilled in the art that various changes and modifications may be made without departing from the spirit and scope of the invention as defined in the following claims.

Although the description has been made of the image sensing device including two sampling stages, the present invention is not limited to this structure. In another embodiment, an image sensing device may include three or more sampling stages. In case of three or more sampling stages, at least one storage unit may be coupled to a plurality of sinking units except for a sinking unit at the end of the plurality of sinking units.

Further, although the description has been made of the image sensing device performing a sampling operation from downward to upward, the present invention is not limited to this structure. In another embodiment, an image sensing device may perform a sampling operation from upward to downward, a sampling operation only upward, or a sampling operation only downward.

Further, although the description has been made of the ADC including a sinking unit of an NMOS transistor, the present invention is not limited to this structure. In another embodiment, the ADC may include a source unit of a PMOS transistor. At this time, the source unit may be disposed between a supply voltage terminal and a reference node, and a ramp voltage generator may be disposed between the reference node and a ground voltage terminal.

What is claimed is:

1. An analog-to-digital conversion circuit comprising:
   a plurality of current sources sequentially activated in a plurality of sampling stages, each current source suitable for generating a reference current which is adjusted upward or downward by a different level in a corresponding sampling stage;
   a ramp voltage generating unit suitable for generating a ramp voltage corresponding to the reference current; and
   a comparison unit suitable for comparing the ramp voltage with a voltage level of a pixel signal to output a comparison signal,
   wherein the current source generates the reference current which is adjusted from a coarse level to a fine level according as the number of the sampling stage increases, and reflects a current level of the reference current corresponding a sampling result in a previous sampling stage on a next sampling stage.

2. The analog-to-digital conversion circuit according to claim 1, further comprising:
   at least one memory unit suitable for storing the current level of the reference current.

3. The analog-to-digital conversion circuit according to claim 1, further comprising:
   a control unit suitable for controlling an activation of the current sources in response to first and second signals, which are sequentially activated at first and second sampling stages, and an output signal of the comparison unit.

4. An analog-to-digital conversion circuit comprising:
   a plurality of sinking units coupled between a ground voltage terminal and a reference node in parallel, each sinking unit suitable for generating a reference current corresponding to a bias signal at the reference node, in a corresponding sampling stage;
   a plurality of switching units suitable for selectively transferring the bias signal to one of the sinking units in response to a plurality of switching signals;
   at least one storage unit coupled to a node between the switching units and the sinking units, suitable for storing a voltage level of the bias signal;
   a ramp voltage generating unit coupled between a supply voltage terminal and the reference node, suitable for generating a ramp voltage corresponding to the reference current;
   a comparison unit suitable for comparing the ramp voltage with a voltage level of a pixel signal to output a comparison signal; and
   a control unit suitable for generating the switching signals in response to a plurality of step signals, which are sequentially activated at the sampling stages, and the comparison signal.

5. The analog-to-digital conversion circuit according to claim 4, wherein the sinking unit generates the reference current which is used in the corresponding sampling stage, and adjusted upward or downward.

6. The analog-to-digital conversion circuit according to claim 4, wherein each of the sinking units comprises a transistor having a size different from each other.

7. The analog-to-digital conversion circuit according to claim 4, wherein the storage unit is coupled to a sinking unit and suitable for storing the voltage level of the bias signal provided to the sinking unit and providing the stored voltage to a next sinking unit.

8. An image sensing device comprising:
   a pixel unit suitable for outputting a pixel signal with a level corresponding to incident light;
   a digital-to-analog converter suitable for generating a sampling current which is used in a sampling stage, and adjusted upward or downward in the sampling stage; and
   an analog-to-digital converter suitable for generating a digital signal corresponding to the pixel signal based on a reference current generated by mirroring the sampling current,
   wherein the analog-to-digital converter generates the reference current which is adjusted from a coarse level to a fine level according as a number of the sampling stage increases, and reflects a current level of the reference current corresponding a sampling result in a previous sampling stage on a next sampling stage.

9. The image sensing device according to claim 8, wherein the analog-to-digital converter compares a reference voltage corresponding to the reference current with a voltage level of the pixel signal in the sampling stage, and outputs the digital signal corresponding to the comparison result.

10. An image sensing device comprising:
- a pixel unit suitable for outputting a pixel signal with a level corresponding to incident light;
- a first current mirroring unit suitable for mirroring a source current to generate a sampling current which is used in a sampling stage and adjusted upward or downward in the sampling stage in response to a control code;
- a second current mirroring unit suitable for generating a bias signal corresponding to the sampling current;
- a plurality of sinking units coupled between a ground voltage terminal and a reference node in parallel, each sinking unit suitable for generating a reference current corresponding to the bias signal at the reference node, in a corresponding sampling stage;
- a plurality of switching units suitable for selectively transferring the bias signal to one of the sinking units in response to a plurality of switching signals;
- at least one storage unit coupled to a node between the switching units and the sinking units, suitable for storing a voltage level of the bias signal;
- a ramp voltage generating unit coupled between a supply voltage terminal and the reference node, suitable for generating a ramp voltage corresponding to the reference current;
- a comparison unit suitable for comparing the ramp voltage with the pixel signal to output a comparison signal; and
- a control unit suitable for generating the switching signals in response to a plurality of step signals, which are sequentially activated at the corresponding sampling stage, and the comparison signal.

11. The image sensing device according to claim 10, wherein the first current mirroring unit generates the sampling current which is adjusted upward or downward by the same level in the sampling stage.

12. The image sensing device according to claim 11, wherein each of the sinking units comprises a transistor having a size different from each other.

13. The image sensing device according to claim 10, wherein the first current mirroring unit generates the sampling current which is adjusted upward or downward by a different level in each of the sampling stages.

14. The image sensing device according to claim 10, wherein each of the sinking units comprises a transistor having the same size.

15. The image sensing device according to claim 10, wherein the storage unit is coupled to a sinking unit and suitable for storing the voltage level of the bias signal provided to the sinking unit and providing the stored voltage to a next sinking unit.

16. A method for driving an image sensing device, comprising:
- in a first sampling step, mirroring a source current to generate a sampling current which is adjusted downward by a first level in response to a control code, generating a ramp voltage corresponding to a reference current by mirroring the sampling current, and sampling a pixel signal outputted from a pixel based on the ramp voltage; and
- in a second sampling step, mirroring the source current to generate the sampling current which is adjusted upward by a second level in response to the control code, generating the ramp voltage corresponding to the reference current by mirroring the sampling current, and sampling the pixel signal based on the ramp voltage.

17. The method according to claim 16, wherein the second sampling step is performed after a result of the first sampling step is reflected on the second sampling step.

18. The method according to claim 16, wherein the ramp voltage of the second sampling step is ramped by a fine level in comparison with the ramp voltage of the first sampling step.

19. The method according to claim 16, further comprising:
- performing a third sampling step where the first and second sampling steps are repeatedly performed.

* * * * *